United States Patent
Chiang

(10) Patent No.: US 7,999,712 B2
(45) Date of Patent: Aug. 16, 2011

(54) DIGITAL-TO-ANALOG CONVERTERS AND METHODS THEREOF

(75) Inventor: Chia-Feng Chiang, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 218 days.

(21) Appl. No.: 12/512,217

(22) Filed: Jul. 30, 2009

(65) Prior Publication Data

US 2011/0025538 A1 Feb. 3, 2011

(51) Int. Cl.
*H03M 1/66* (2006.01)
(52) U.S. Cl. .......................... 341/144; 341/139; 341/143
(58) Field of Classification Search .................. 341/155, 341/144, 143, 139
See application file for complete search history.

(56) References Cited

U.S. PATENT DOCUMENTS

| 6,281,821 | B1 | 8/2001 | Rhode et al. | |
|---|---|---|---|---|
| 7,020,293 | B2 | 3/2006 | Shimotoyodome | |
| 7,254,244 | B2 | 8/2007 | Henson et al. | |
| 2002/0018013 | A1* | 2/2002 | Nakao et al. | 341/144 |
| 2010/0062736 | A1* | 3/2010 | Zeng | 455/234.1 |

* cited by examiner

*Primary Examiner* — Peguy JeanPierre
(74) *Attorney, Agent, or Firm* — Thomas|Kayden

(57) ABSTRACT

A digital-to-analog converter for converting a digital signal into an analog signal is provided. The digital-to-analog converter includes a preprocessing unit, a gain controller, a modulator and an output unit. The preprocessing unit receives and oversamples the digital signal to generate an oversampled signal. The gain controller generates an adjusted signal with a gain function according to a reference signal associated with the oversampled signal when a specific condition is present. The modulator modulates the adjusted signal and generates a modulated signal. The output unit provides the analog signal to a load according to the modulated signal, wherein the analog signal gradually approaches to a specific level according to the gain function when the specific condition is present.

22 Claims, 6 Drawing Sheets

DIGITAL-TO-ANALOG CONVERTERS AND METHODS THEREOF

BACKGROUND

1. Technical Field

The disclosed embodiments relate to a digital-to-analog converter, and more particularly to a digital-to-analog converter with power on/off transient suppression.

2. Description of the Related Art

Currently, digital-to-analog converters (DACs) are widely used in audio and video applications, which are devices for converting a digital (usually binary) code to at least an analog signal. In audio applications, the DAC may have a single-end output or differential outputs for driving a load, such as a headphone or a speaker, according to design consideration for various products.

In single-end output DACs, a direct current (DC) blocking capacitor may be employed between an amplifier of the DAC and a load in order to block the DC voltage. However, the single-end DAC may suffer from large transient signals appearing at the outputs when initially powered on. Such DACs present an analog output centered on a signal ground level, such as ½ VDD. The transient signal occurs when a power is applied to the DAC, and the analog outputs are required to move from a ground (GND) level to the signal ground level. If the transient signal occurs rapidly, it can be approximated as a step function, which has energy at all frequencies. On power-up, such a system can suffer an annoying noise, such as a "pop" or "click", heard by a speaker when the DAC initially charges the blocking capacitor to the signal ground level.

Similarly, a click or pop may occur when the system is powered off. On entering the power-off state, the charge on the blocking capacitor remains. When the power is removed, the residual charge of the blocking capacitor may discharge rapidly across the load resulting in a loud noise.

BRIEF SUMMARY

Digital-to-analog converters for converting a digital signal into an analog signal and methods thereof are provided. An exemplary embodiment of a digital-to-analog converter for converting a digital signal into an analog signal is provided. The digital-to-analog converter comprises a preprocessing unit, a gain controller, a modulator and an output unit. The preprocessing unit receives and oversamples the digital signal to generate an oversampled signal. The gain controller generates an adjusted signal with a gain function according to a reference signal associated with the oversampled signal when a specific condition is present. The modulator modulates the adjusted signal and generates a modulated signal. The output unit provides the analog signal to a load according to the modulated signal, wherein the analog signal gradually approaches to a specific level according to the gain function when the specific condition is present.

Moreover, an exemplary embodiment of a digital-to-analog converter for converting a digital signal into an analog signal is provided. The digital-to-analog converter comprises a gain controller, a preprocessing unit, a modulator and an output unit. The gain controller receives the digital signal, adjusts the received digital signal with a gain function, and generates an adjusted signal when a specific condition is present. The preprocessing unit oversamples the adjusted signal to generate an oversampled signal. The modulator modulates the oversampled signal and generates a modulated signal. The output unit provides the analog signal to a load according to the modulated signal, wherein the analog signal gradually approaches to a specific level according to the gain function when the specific condition is present.

Furthermore, an exemplary embodiment of a method for converting a digital signal into an analog signal by a digital-to-analog converter with an output unit is provided. The digital signal is oversampled. An adjusted signal is generated with a gain function when a specific condition is present. The adjusted signal is modulated. The analog signal is provided according to the modulated signal, wherein the analog signal gradually approaches to a specific level according to the gain function when the specific condition is present.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. The description is made for the purpose of illustrating the general principles of the invention and should not be taken in a limiting sense. The scope of the invention is best determined by reference to the appended claims.

Figure 1:
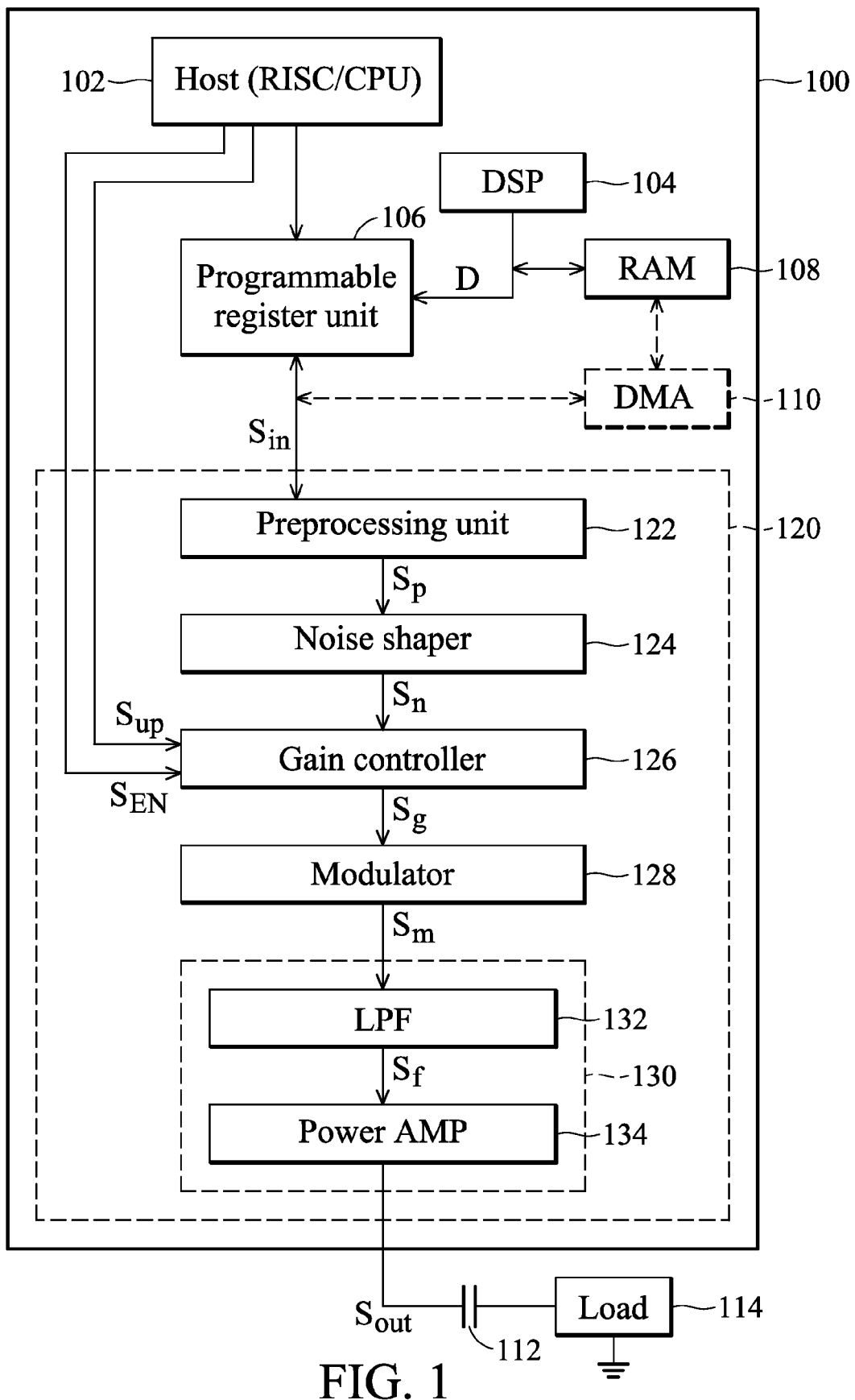
FIG. 1 shows a schematic diagram illustrating a system with a digital-to-analog converter (DAC) according to an embodiment of the invention.

FIG. 1 shows a schematic diagram illustrating a system 100 with a digital-to-analog converter (DAC) 120 according to an embodiment of the invention. The system 100 is used to provide an analog signal $S_{out}$ to drive a load 114 via a capacitor 112. For example, the analog signal $S_{out}$ is an audio signal and the load 114 may be a headphone or a speaker. The system 100 comprises a host 102, a digital signal processor (DSP) 104, a programmable register unit 106, a random access memory (RAM) 108 and the DAC 120. The host 102 may be a central processing unit (CPU) or a reduced instruction set computer (RISC). The host 102 controls the programmable register unit 106 to receive a digital signal D from the DSP 104 or the RAM 108. After receiving the digital signal D, the programmable register unit 106 accordingly provides a digital signal $S_{in}$ to the DAC 120 according to configurations from the host 102. In one embodiment, the system 100 further comprises a direct memory access (DMA) engine 110 for accessing the RAM 108 to retrieve data as the digital signal $S_{in}$.

Referring to FIG. 1, the DAC 120 comprises a preprocessing unit 122, a noise shaper 124, a gain controller 126, a modulator 128 and an output unit 130. The preprocessing unit 122 comprises an up sample circuit for oversampling the digital signal $S_{in}$ to obtain a signal $S_p$. For example, the preprocessing unit 122 may oversample the digital signal $S_{in}$ sampled at 48 KHz to 384 KHz. In general, one of the noise shaping algorithms used in image processing is 'Floyd Steinberg dithering', and many noise shaping algorithms used in audio processing are based on an 'Absolute threshold of hearing' model. After oversampling, the noise shaper 124 performs a noise shaping algorithm to reduce the noise of signal $S_p$ by shifting it away from the desirable band. For example, if the signal $S_p$ is an audio signal, the noise shaper 124 may shape the audio signal $S_p$ to suppress in-band noise by shifting the noise away from the audio band (0 to 20 KHz) with delta-sigma modulation. After noise shaping, the noise shaper 124 provides a signal $S_n$ to the gain controller 126, so as to provide a signal $S_g$ to the modulator 128 by the gain controller 126 according to the signals $S_{EN}$ and $S_{up}$ from the host 102. The gain controller 126 will be described in detail below. The signal $S_g$ is inputted to the modulator 128 and is modulated into a signal $S_m$ with a specific modulation, such as Pulse-width modulation (PWM), Pulse-density modulation (PDM), delta-sigma modulation and so forth, wherein the modulation type is determined according to applications. The output unit 130 then receives the signal $S_m$ to generate and output the analog signal $S_{out}$ to the load 114. In an embodiment of the invention, the output unit 130 comprises a low pass filter (LPF) 132 and a power amplifier 134. The LPF 132 filters the signal $S_m$ to obtain a signal $S_f$, and then the signal $S_f$ is amplified by the power amplifier 134 to generate the analog signal $S_{out}$ to the load 114 via the capacitor 112. The LPF 132 and the power amplifier 134 may be single-end output type circuits or the differential output type circuits, which are determined according to the load 114.

Figure 2:
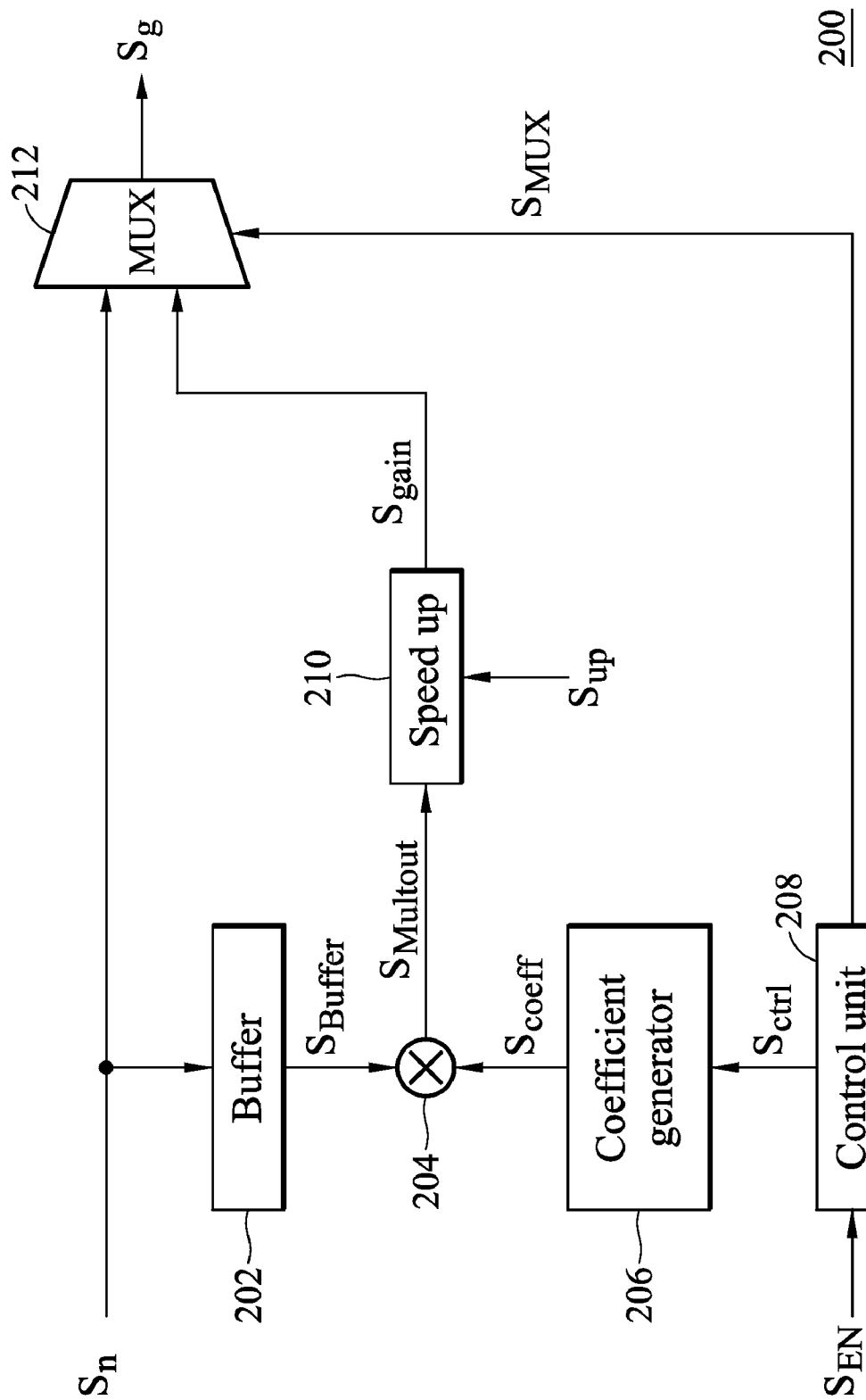
FIG. 2 shows a schematic diagram illustrating a gain controller according to an embodiment of the invention.

FIG. 2 shows a schematic diagram illustrating a gain controller 200 according to an embodiment of the invention. The gain controller 200 comprises a buffer 202, a multiplier 204, a coefficient generator 206, a control unit 208, a speeding up unit 210 and a selecting unit 212. Referring to FIG. 1 and FIG. 2 together, the buffer 202 is used to buffer the signal $S_n$ from the noise shaper 124 and provide a signal $S_{Buffer}$ to the multiplier 204. Furthermore, when the control unit 208 receives the signal $S_{EN}$ indicating that a specific condition is present, a control signal $S_{ctrl}$ is provided to the coefficient generator 206, so as to allow the coefficient generator 206 to generate the corresponding coefficient $S_{coeff}$ according to a gain function, wherein whether the specific condition is present or absent is determined by the host 102. For example, when a power on or off procedure of the output unit 130 is being processed, the host 102 determines that the specific condition is present such that the analog signal $S_{out}$ is controlled to avoid false action for the load 114. The gain function may be a ramp function, an exponent function, a function formed by a look-up table, or other mathematical functions and so on.

Referring to FIG. 2, when receiving the signal $S_{Buffer}$ and the coefficient $S_{coeff}$, the multiplier 204 multiplies the signal $S_{Buffer}$ by the coefficient $S_{coeff}$ to obtain a signal $S_{Multout}$. The speeding up unit 210 receives the signal $S_{Multout}$ to provide a signal $S_{gain}$ according to the signal $S_{up}$ which indicates whether to speed up control over the analog signal $S_{out}$. When the specific condition is present and the signal $S_{gain}$ is ready, the control unit 208 controls the selecting unit 212 via a signal $S_{MUX}$ to select the signal $S_{gain}$ as the signal $S_g$. On the contrary, when the specific condition is absent, the control unit 208 controls the selecting unit 212 to select the signal $S_n$ as the signal $S_g$. In the embodiment, the selecting unit 212 is a multiplexer.

Figure 3:
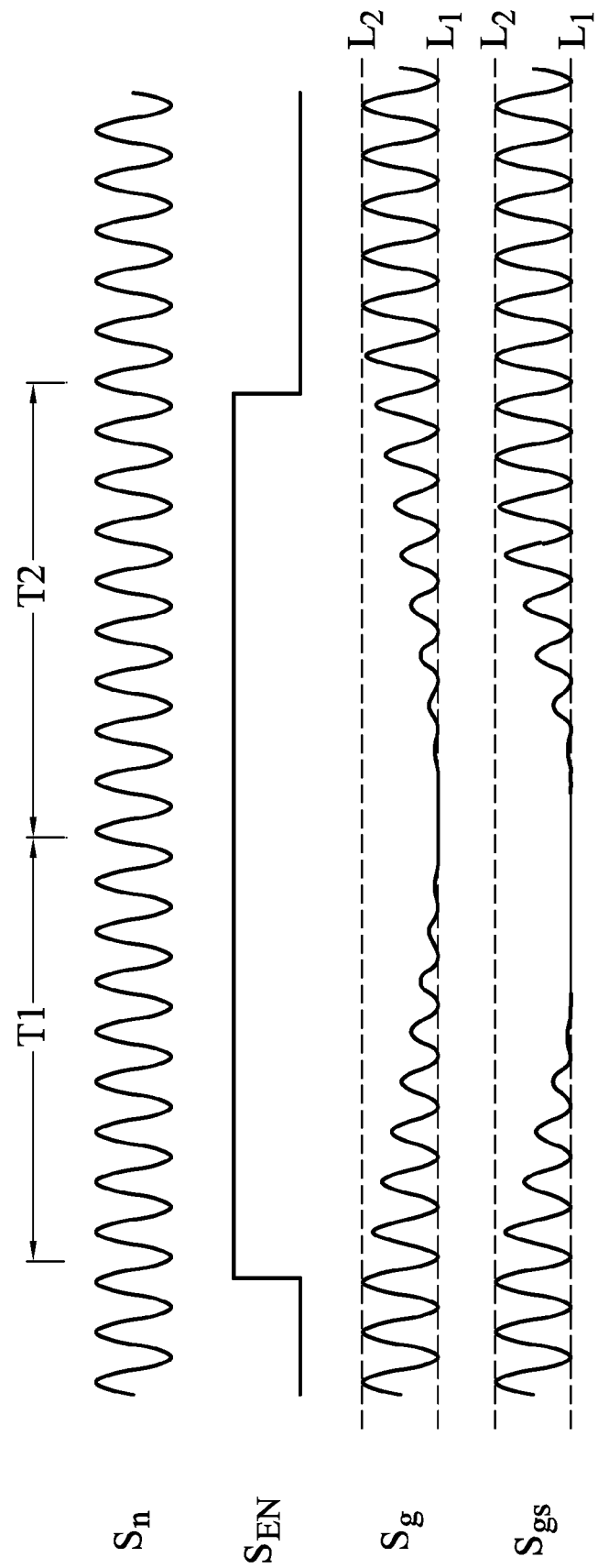
FIG. 3 shows an exemplary waveform diagram illustrating the signals of the gain controller of FIG. 2, wherein the gain controller is implemented in a single-end output system.

FIG. 3 shows an exemplary waveform diagram illustrating the signals of the gain controller 200, wherein the gain controller 200 is implemented in a single-end output system. During a time period T1, the signal $S_{EN}$ is changed from a low to high logic level when a specific condition is present, such as when a power off procedure of an output unit of the single-end output system is being processed or when a mute procedure is enabled. As shown in FIG. 3, the signal $S_n$ is a continuous signal, such as a 1 KHz signal for an audio application. Referring to FIG. 2 and FIG. 3 together, at time period T1, the control unit 208 controls the coefficient generator 206 to generate the corresponding coefficient $S_{coeff}$ according to a ramp down function. Accordingly, the signal $S_g$ gradually approaches to a level $L_1$. A signal $S_{gs}$ of FIG. 3 indicates the output of the selecting unit 212 when the speeding up unit 210 is active, i.e. the signal $S_{up}$ indicates that speed up is needed. Therefore, the signal $S_{gs}$ approaches to the level $L_1$ earlier than the signal $S_g$ during time period T1. During a time period T2, the signal $S_{EN}$ remains at a high logic level when another specific condition is present, such as when a power on procedure of the output unit is being processed or when the mute procedure is disenabled and changes to a low logic level thereafter. At time period T2, the control unit 208 controls the coefficient generator 206 to generate the corresponding coefficient $S_{coeff}$ according to a ramp up function. Accordingly, the signal $S_g$ gradually approaches to a level $L_2$. Similarly, the signal $S_{gs}$ approaches to the level $L_2$ earlier than the signal $S_g$ during time period T2. In the embodiment, the speeding up unit 210 may comprise a logical shifter for performing a shift right arithmetic operation to speed up the signal $S_{gs}$ from the level $L_2$ to level $L_1$ and performing a shift left arithmetic operation to speed up the signal $S_{gs}$ from the level $L_1$ to level $L_2$. Referring to FIG. 1 and FIG. 3, the waveform of the analog signal $S_{out}$ is substantially similar to the signal $S_g$, as known in the art. Therefore, the load 114 may receive the analog signal $S_{out}$ with gradually decreased amplitude at time period T1 and receive the analog signal $S_{out}$ with gradually increased amplitude at time period T2, thus avoiding the loud noise caused by power on/off transient when the load 114 is a headphone or a speaker.

Figure 4:
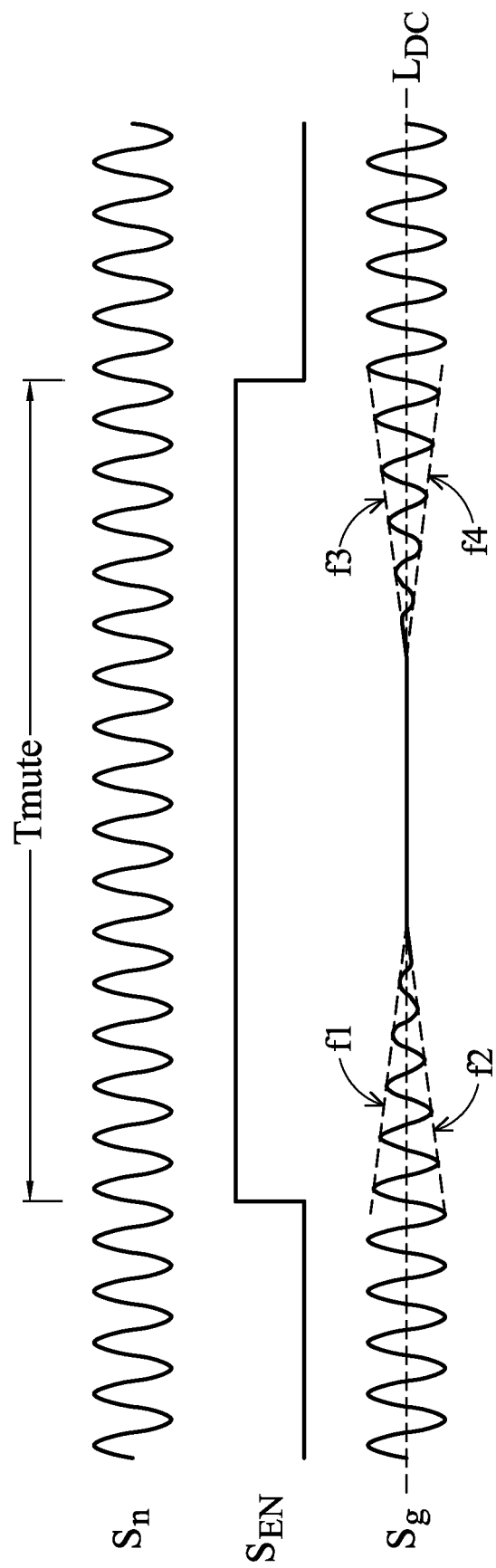
FIG. 4 shows an exemplary waveform diagram illustrating the signals of the gain controller of FIG. 2, wherein the gain controller is implemented in a differential output system.

FIG. 4 shows an exemplary waveform diagram illustrating the signals of the gain controller 200, wherein the gain controller 200 is implemented in a differential output system. In the embodiment, the system is used for audio application and the signal $S_{EN}$ is changed to a high logic level until a mute procedure is disabled. At time period Tmute, the signal $S_g$ gradually approaches to a DC level $L_{DC}$ and then regains to the waveform of the signal $S_n$, as shown in FIG. 4. For example, at the beginning of the time period Tmute, the gain controller 200 generates the signal $S_g$ with an amplitude higher than the DC level $L_{DC}$ according to a gain function f1 and the signal $S_g$ with an amplitude lower than the DC level $L_{DC}$ according to a gain function f2. At the end of the time period Tmute, the gain controller 200 generates the signal $S_g$ with an amplitude higher than the DC level $L_{DC}$ according to a gain function f3 and the signal $S_g$ with an amplitude lower than the DC level $L_{DC}$ according to a gain function f4.

Figure 5:
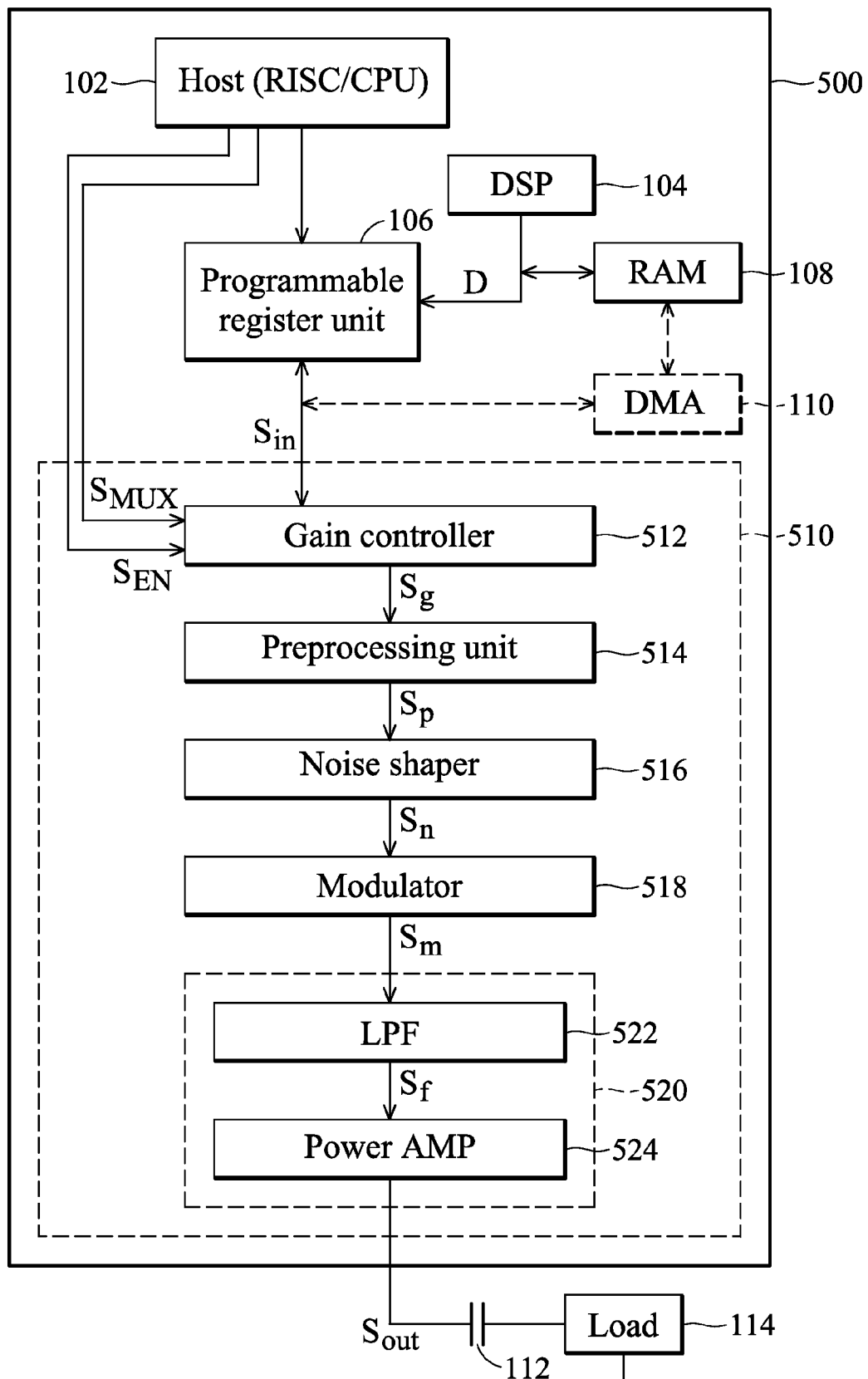
FIG. 5 shows a schematic diagram illustrating a system with a DAC according to another embodiment of the invention.

FIG. 5 shows a schematic diagram illustrating a system 500 with a DAC 510 according to another embodiment of the invention. Compared with the system 100 of FIG. 1, the system 500 comprises the DAC 510 having a gain controller 512, a preprocessing unit 514, a noise shaper 516, a modulator 518 and an output unit 520, wherein the gain controller 512 is disposed between the programmable register unit 106 and the preprocessing unit 514. Therefore, the gain controller 512 receives the digital signal $S_{in}$ from the programmable register unit 106, and provides the signal $S_g$ to the preprocessing unit 514 according to the signals $S_{EN}$ and $S_{MUX}$. When the signal $S_{EN}$ indicates that a specific condition is present, the gain controller 512 adjusts the digital signal $S_{in}$ with at least a gain function. Otherwise, the gain controller 512 directly transmits the digital signal $S_{in}$ to the preprocessing unit 514 as the signal $S_g$ without adjustment. Next, the preprocessing unit 514 oversamples the signal $S_g$ to obtain the signal $S_p$. After oversampling, the noise shaper 516 performs a noise shaping algorithm to reduce the noise of signal $S_p$ by shifting it away from the desirable band to obtain the signal $S_n$. The signal $S_n$ is inputted to the modulator 518 and is modulated into the signal $S_m$ with a specific modulation, such as PWM, PDM, delta-sigma modulation and so forth, wherein the modulation type is determined according to application. In the output unit 520, the LPF 522 filters the signal $S_m$ to obtain the signal $S_f$, and the power amplifier 134 amplifies the signal $S_f$ to obtain the analog signal $S_{out}$.

Figure 6:
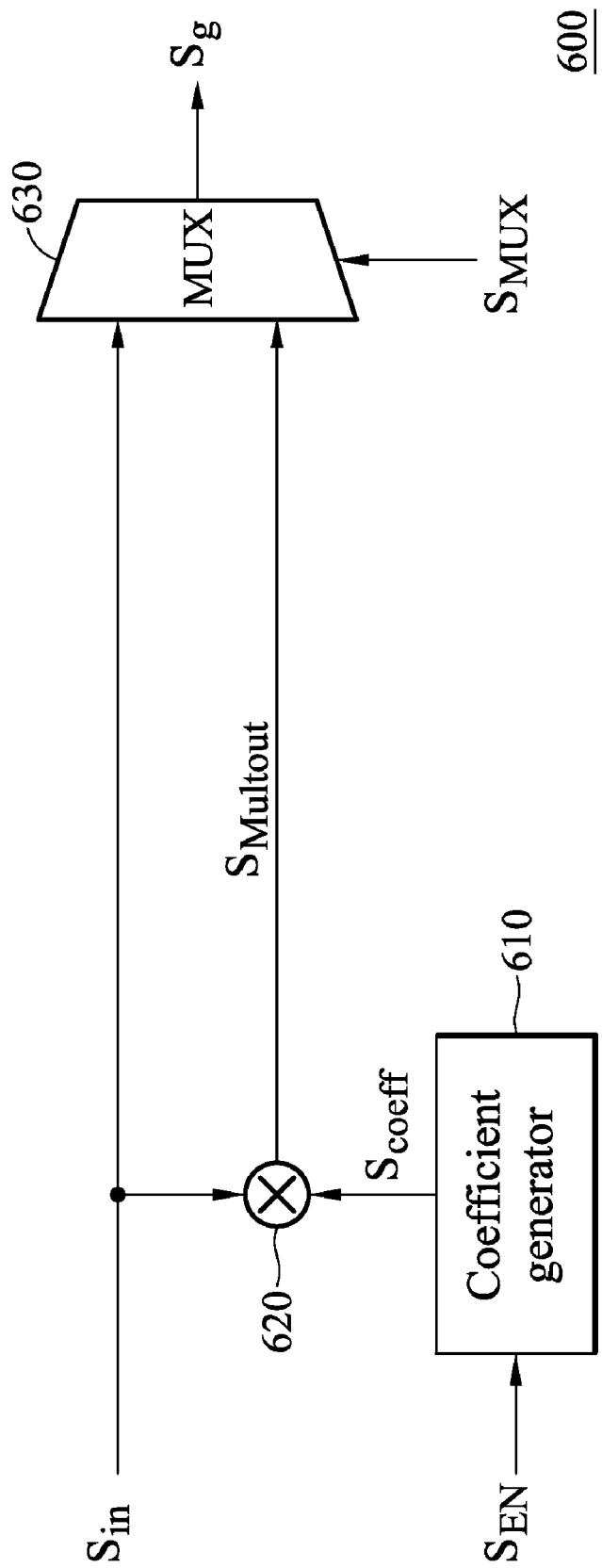
FIG. 6 shows a schematic diagram illustrating a gain controller according to an embodiment of the invention.

FIG. 6 shows a schematic diagram illustrating a gain controller 600 according to an embodiment of the invention. The gain controller 600 comprises a coefficient generator 610, a multiplier 620 and a selecting unit 630. Referring to FIG. 5 and FIG. 6 together, when receiving the signal $S_{EN}$ indicating that a specific condition is present, the coefficient generator 610 starts to generate the corresponding coefficient $S_{coeff}$ according to a gain function, wherein whether the specific condition is present or absent is determined by the host 102. For example, when a power on or off procedure of the output unit 520 is being processed, the host 102 determines that the specific condition is present such that the analog signal $S_{out}$ is controlled to avoid false action for the load 114. Furthermore, the gain function may be a ramp function, an exponent function, a function formed by a look-up table, or other mathematical functions and so on. When receiving the digital signal $S_{in}$ and the coefficient $S_{coeff}$, the multiplier 620 multiplies the digital signal $S_{in}$ by the coefficient $S_{coeff}$ to obtain the signal $S_{Multout}$. Therefore, the host 102 may control the selecting unit 630 via the signal $S_{MUX}$ to select the signal $S_{Multout}$ as the signal $S_g$ when the specific condition is present, and may control the selecting unit 630 to select the digital signal $S_{in}$ as the signal $S_g$ when the specific condition is absent. In one embodiment, a buffer coupled between the programmable register unit 106 and the multiplier 620 is added to buffer the digital signal $S_{in}$, and a speeding up unit coupled between the multiplier 620 and the selecting unit 630 is added to speed up the change of the signal $S_g$.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A digital-to-analog converter for converting a digital signal into an analog signal, comprising:
    a preprocessing unit receiving and oversampling the digital signal to generate an oversampled signal;
    a gain controller generating an adjusted signal with a gain function according to a reference signal associated with the oversampled signal when a specific condition is present;
    a modulator modulating the adjusted signal and generating a modulated signal; and
    an output unit providing the analog signal to a load according to the modulated signal, wherein the analog signal gradually approaches to a specific level according to the gain function when the specific condition is present.

2. The digital-to-analog converter as claimed in claim 1, wherein the gain controller directly transmits the reference signal to the modulator when the specific condition is absent.

3. The digital-to-analog converter as claimed in claim 1, further comprising a noise shaper shaping the oversampled signal to generate a shaped signal, wherein the reference signal is the oversampled signal or the shaped signal.

4. The digital-to-analog converter as claimed in claim 1, wherein the gain controller comprises:
    a coefficient generator generating a plurality of coefficients according the gain function;
    a multiplier multiplying the reference signal by the coefficients to obtain the adjusted signal; and
    a selecting unit providing the reference signal to the modulator when the specific condition is absent and providing the adjusted signal to the modulator when the specific condition is present.

5. The digital-to-analog converter as claimed in claim 4, wherein the gain controller further comprises:
    a buffer storing the reference signal; and
    a speeding up unit coupled between the selecting unit and the multiplier, speeding up the adjusted signal to approach the specific level.

6. The digital-to-analog converter as claimed in claim 1, wherein the specific condition is present when a power on or off procedure of the output unit is being processed.

7. The digital-to-analog converter as claimed in claim 1, wherein the gain function comprises a ramp function or an exponential function.

8. The digital-to-analog converter as claimed in claim 1, wherein the output unit comprises:
    a low pass filter filtering the modulated signal; and
    a power amplifier amplifying the filtered signal to generate the analog signal to the load.

9. The digital-to-analog converter as claimed in claim 1, wherein the modulator modulates the adjusted signal with a Pulse-width modulation, a Pulse-density modulation or a delta-sigma modulation.

10. A digital-to-analog converter for converting a digital signal into an analog signal, comprising:
    a gain controller receiving the digital signal, adjusting the received digital signal with a gain function, and generating an adjusted signal when a specific condition is present;
    a preprocessing unit oversampling the adjusted signal to generate an oversampled signal;
    a modulator modulating the oversampled signal and generating a modulated signal; and
    an output unit providing the analog signal to a load according to the modulated signal, wherein the analog signal gradually approaches to a specific level according to the gain function when the specific condition is present.

11. The digital-to-analog converter as claimed in claim 10, wherein the gain controller directly transmits the received signal to the preprocessing unit when the specific condition is absent.

12. The digital-to-analog converter as claimed in claim 11, wherein the gain controller comprises:
    a coefficient generator generating a plurality of coefficients according the gain function;
    a multiplier multiplying the received digital signal by the coefficients to obtain the adjusted signal; and
    a selecting unit providing the received digital signal to the preprocessing unit when the specific condition is absent and providing the adjusted signal to the preprocessing unit when the specific condition is present.

13. The digital-to-analog converter as claimed in claim 12, wherein the gain controller further comprises:
   a buffer storing the received digital signal; and
   a speeding up unit coupled between the selecting unit and the multiplier, speeding up the adjusted signal to approach the specific level.

14. The digital-to-analog converter as claimed in claim 10, wherein the specific condition is present when a power on or off procedure of the output unit is being processed.

15. The digital-to-analog converter as claimed in claim 10, wherein the gain function comprises a ramp function or an exponential function.

16. The digital-to-analog converter as claimed in claim 10, wherein the output unit comprises:
   a low pass filter filtering the modulated signal; and
   a power amplifier amplifying the filtered signal to generate the analog signal to the load.

17. The digital-to-analog converter as claimed in claim 10, wherein the modulator modulates the adjusted signal with a Pulse-width modulation, a Pulse-density modulation or a delta-sigma modulation.

18. A method for converting a digital signal into an analog signal by a digital-to-analog converter with an output unit, comprising:
   oversampling the digital signal to generate an oversampled signal;
   generating an adjusted signal with a gain function according to a reference signal associated with the oversampled signal when a specific condition is present;
   modulating the adjusted signal to generate a modulated signal; and
   providing the analog signal according to the modulated signal, wherein the analog signal gradually approaches to a specific level according to the gain function when the specific condition is present.

19. The method as claimed in claim 18, wherein the modulation comprises modulating the reference signal to generate the modulated signal when the specific condition is absent.

20. The method as claimed in claim 19, further comprising shaping the oversampled signal to generate a shaped signal, wherein the reference signal is the oversampled signal or the shaped signal.

21. The method as claimed in claim 18, wherein the output unit of the digital-to-analog converter provides the analog signal to a load, and the specific condition is present when a power on or off procedure of the output unit is being processed.

22. The method as claimed in claim 18, wherein the gain function comprises a ramp function or an exponential function.

* * * * *